(12) United States Patent
Goodwin et al.

(10) Patent No.: US 6,226,709 B1
(45) Date of Patent: *May 1, 2001

(54) MEMORY REFRESH CONTROL SYSTEM

(75) Inventors: Paul M. Goodwin, Littleton; Stephen Van Doren, Northborough, both of MA (US)

(73) Assignee: Compaq Computer Corporation, Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/957,688

(22) Filed: Oct. 24, 1997

(51) Int. Cl.[7] .................................................. G06F 12/00
(52) U.S. Cl. ........................ 711/106; 711/101; 711/104; 711/105; 711/152; 711/163; 711/167
(58) Field of Search ........................... 711/152, 154–169, 711/101–106

(56) References Cited

U.S. PATENT DOCUMENTS

| | | | | |
|---|---|---|---|---|
| 5,265,231 | * | 11/1993 | Nuwayser | 711/106 |
| 5,511,176 | * | 4/1996 | Tsuha | 711/106 |
| 5,873,114 | * | 2/1999 | Rahman et al. | 711/106 |
| 5,875,452 | * | 2/1999 | Katayama et al. | 711/105 |
| 5,884,067 | * | 3/1999 | Storm et al. | 711/106 X |
| 5,887,272 | * | 3/1999 | Sartore et al. | 711/105 |

* cited by examiner

Primary Examiner—Than Nguyen
(74) Attorney, Agent, or Firm—Hamilton, Brook, Smith & Reynolds, P.C.

(57) ABSTRACT

A memory system has a plurality of interleaved memory ranks that use SDRAMs requiring a periodic refresh, and an arbiter which controls access to the memory ranks and restricts access to a memory rank being refreshed. The memory ranks are interleaved on a memory module. Counting refresh registers on each memory module are associated with the module's memory ranks. The arbiter has its own counting refresh register. At regular intervals, the arbiter broadcasts a refresh signal along with a refresh address to the modules via a transaction bus. The refresh address provided by the arbiter is latched by the refresh registers which then begin counting at a pre-programmed interval. A refresh to a particular memory rank is triggered when a refresh register associated with the memory rank matches a unique identifier assigned to that rank. The arbiter uses its refresh register to identify the memory rank being refreshed, allowing the arbiter to restrict access to that memory rank. As a result, the memory ranks are refreshed sequentially without ongoing control by the arbiter.

27 Claims, 8 Drawing Sheets

MEMORY REFRESH CONTROL SYSTEM

BACKGROUND OF THE INVENTION

Memory subsystems are typically built with dynamic random access memory (DRAM) devices which retain data by storing electrical charges in capacitive storage cells. Writing to an address charges or discharges the cells depending on the data. Reading from an address depletes the charges, but on-chip circuitry automatically rewrites the data, restoring the cells to their pre-read values. In addition, the cells tend to discharge over time, which unchecked would lead to loss of data.

To prevent this loss of data due to discharge, DRAMs must be periodically refreshed by reading data at some location and writing it back. DRAMs generally provide an atomic refresh operation for this purpose which must be periodically performed on each row. In older DRAMs, this was done by providing a row address and asserting a refresh command. Newer DRAM devices provide an auto-refresh operation, generating a refresh address internally, requiring only that a refresh command be applied externally. During a refresh cycle, all of the DRAM is unavailable.

Similarly, after a read or write, while the charges in a cell are being restored, a DRAM is not accessible. If a multiple device memory system is configured such that adjacent addresses are on the same device, sequential accesses to those adjacent addresses must be delayed while the device is recharging. To increase bandwidth, memory units using DRAMS are interleaved, meaning that memory units are configured so that adjacent memory addresses are not in the same unit. Accessing a series of adjacent addresses will therefore not require a delay because the unit that was previously accessed and is currently recharging is not the unit accessed next.

CPU/memory systems, whether single or multiprocessor, have traditionally relied on a single common data bus connecting all CPUs, memories and other directly addressed ports and peripherals. In these conventional systems, there are in general two ways to implement a memory refresh scheme. One is to have hardware associated with individual memory modules trigger the refresh operations. When a CPU attempts to access an address on a DRAM which is in a refresh cycle, a "stall" signal must stall the system until the refresh is complete. This locks up the bus on average for one half of a refresh cycle.

The other refresh scheme is to have a bus controller schedule refreshes. This method locks up the bus for the duration of the refresh cycle.

In the traditional single data path system, only one memory unit can be accessed by only one CPU at any time. The other CPUs must wait their turn. As an alternative, a cross-bar switch can simultaneously provide multiple data paths between memory modules and CPUs and other ports. Thus all CPUs may access different memory modules simultaneously. An arbiter configures the cross-bar switch according to the needs of the CPUs, and commands the memory modules by sending transaction codes, such as read, write and refresh, to the modules via a transaction bus.

In this cross-bar switch system, where a plurality of CPUs may access a plurality of memory units at the same time, it is crucial that as few memory units as possible be unavailable due to access latency. A highly interleaved system provides a high number of interleaved units, most of which are available at any given time due to the higher number of memory units than CPUs. This greatly increases the probability that addressed memory units will be available.

All of these interleaved memory units need to be refreshed periodically. As with the traditional single data path system described above, each memory module can trigger its own refreshes, or a bus controller, in this case the arbiter, can trigger the refreshes.

In the preferred embodiment, a directory module keeps track of the current "owner" of a cache block as well as who has a copy of the cache block. The "owner" is the CPU or I/O device that has the most up-to-date copy, i.e., the last to modify the block in cache. If no modified copies exist, then the main memory is the owner. When a CPU requests a copy of a cache block, the directory directs the request to the owner of that cache block. The directory therefore maintains data coherency. The directory module does this by maintaining a "line" for every cache block. These lines are associated with the memory units in the system memory and are themselves made up of memory devices requiring periodic refresh.

SUMMARY OF THE INVENTION

The invention resides in refreshing memory units in a computer system. In a highly interleaved system, there are many interleaved units, each needing to be refreshed. If all were to be refreshed simultaneously, an arbiter would first have to wait for all units to be idle. In addition, because memory is unavailable during refresh, there can be no memory accesses during the refresh cycle. It is therefore desirable to refresh only one interleaved unit at a time, so that at most only one unit is unavailable at any given time. However, if the arbiter needed to send a refresh transaction for every unit, it would increase traffic dramatically on the transaction bus, significantly reducing data transfer bandwidth.

In accordance with the invention, a memory system comprises a plurality of memory units and an arbiter which controls access to the memory units and restricts access to a memory unit being refreshed. Refresh registers are associated with the memory units and the arbiter. The refresh registers sequence through memory unit identifiers. Each memory unit is triggered to a refresh when a refresh register associated with the memory unit holds a designated value. The refresh register associated with the arbiter identifies the memory unit being refreshed, allowing the arbiter to restrict access to that memory unit. As a result, the memory units may be refreshed sequentially without ongoing control by the arbiter, which could stall the transaction bus, yet the arbiter retains identification of the unit being refreshed for appropriate control of access to the memory units.

In the preferred embodiment, the memory units are interleaved to the level of memory ranks which are interleaved among memory arrays. The memory arrays are in turn interleaved within memory modules. Each memory module has one refresh register which is associated with all of the memory ranks supported by the module. The refresh registers are counters which increment at intervals of a preprogrammed number of clock cycles. When the refresh register associated with a memory module matches a unique ID, or physical rank number (PRN), associated with a memory rank supported by the memory module, that memory rank is triggered to an auto-refresh cycle. The refresh registers begin counting when the arbiter broadcasts a refresh signal to the memory modules.

It is neither efficient nor necessary for the refreshing to always begin with the same memory rank. If it were the case, that same rank would never be available for access at the beginning of a counting sequence. In other words, if the sequence always had to begin with the same memory rank, the arbiter would not be able to connect a CPU requesting access to that rank until that rank's refresh cycle was over, causing unnecessary delay. For this reason, the arbiter provides a refresh address along with the refresh signal. The memory modules latch this address into their respective refresh registers and begin counting from the address provided.

In an alternative embodiment, rather than having the arbiter broadcast a refresh signal, respective timers are associated with the memory modules and arbiter. The timers are initialized and synchronized as part of a memory configuration, and start the refresh sequence periodically.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

Figure 1:
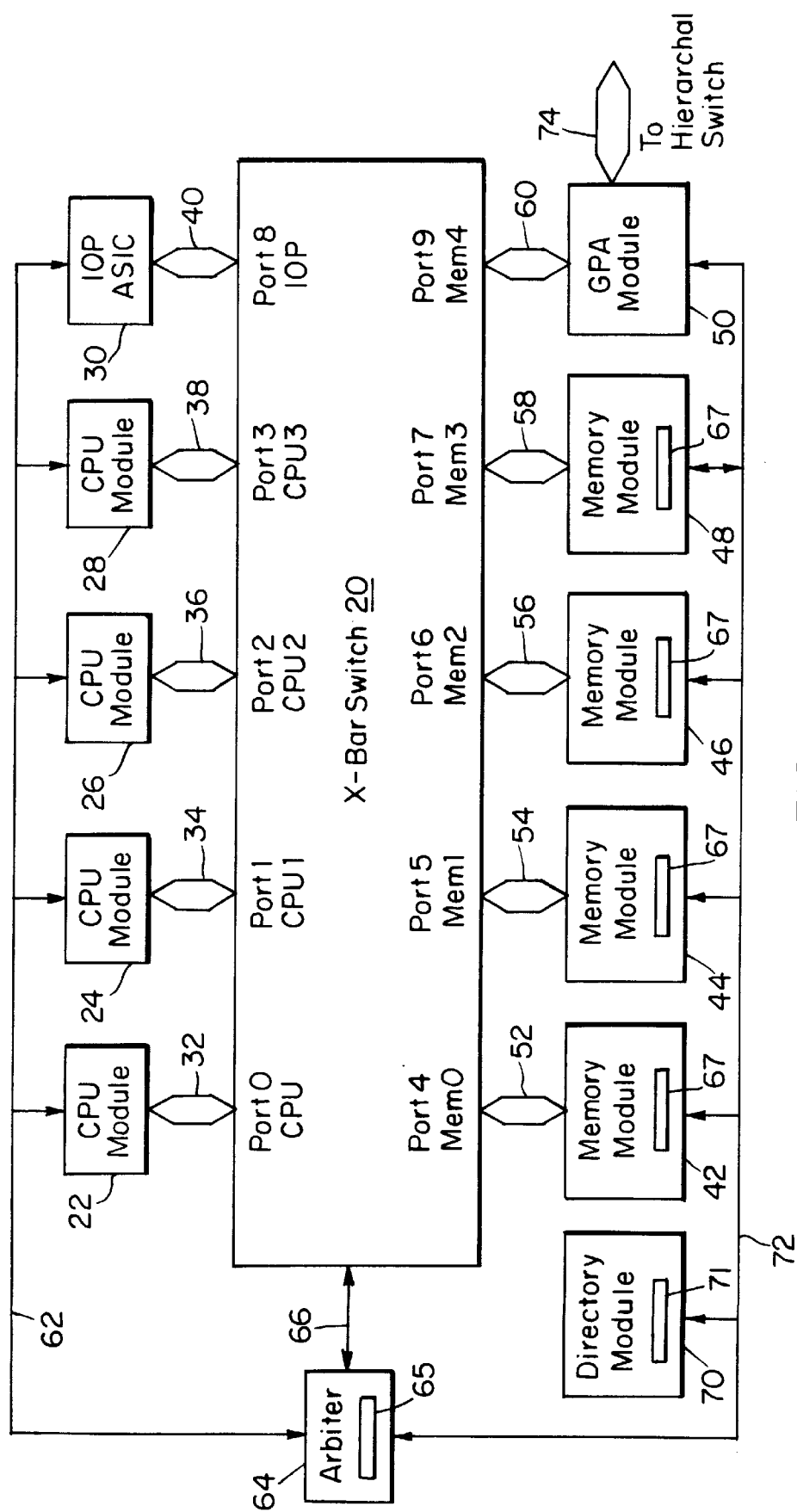
FIG. 1 is a block diagram of a switch-based multiprocessor system.

FIG. 1 shows a general layout of one embodiment of the system. In this embodiment, a cross-bar switch 20 connects up to four memory modules 42, 44, 46, 48, each comprising up to eight interleaved memory ranks, to up to four CPUs 22, 24, 26, 28, an I/O port 30 and a global port 50. An arbiter 64 configures the cross-bar switch 20 according to the needs of the CPUs.

The memories are built using synchronous dynamic random access memories (SDRAMs) such as Mitsubishi Electric's M5M4S16S31CTP 2-bank×1MW×8-bit device. Refer to the Mitsubishi specification for the M5M4S16S1CTP-7,-8,-10 (March '96 Preliminary) which is incorporated herein by reference. SDRAMs offer several advantages over plain DRAMs, including higher speed and programmable burst length. As with newer DRAMs, SDRAMs provide an auto-refresh operation. In addition, SDRAMs may provide plural banks which can be interleaved. This would allow one bank to be accessed while the other bank is recharging (being refreshed). Due to the added complexity and little benefit, this interleaving is limited to thirty-two interleaved units. The significance of this is that with single density DIMMs (Dual In-Line Memory Module), all of the internal banks of the SDRAMs are utilized. With a double density DIMM, two internal interleave units are utilized. With a quad-density DIMM, the internal interleaving of the SDRAM devices is not employed.

In the present invention, a memory array is a group of SDRAMs that share common address and data path interconnect. In the preferred embodiment, there are up to two memory arrays per memory module. Each memory array is comprised of four SDRAM DIMMs, with each DIMM supplying a one quarter slice of the array data path.

A memory bank is a group of SDRAM storage devices that shares common address and data path interconnect with other like groups of SDRAM storage devices. Memory banks may be either internal SDRAM banks or independent rows of SDRAMS on a DIMM. In the preferred embodiment, each memory array is comprised of four memory banks. Each memory bank is sliced across the DIMMs of a memory array.

Finally, memory ranks are logical aggregations of pairs of memory banks. They are used to manage access and timing dependencies introduced, for example, by the shared interconnects and internal buffering of the memory module architecture.

At regular intervals, the arbiter sends out a refresh signal and a memory rank refresh address on the transaction bus 72. Refresh registers 65 on the arbiter and 67 on each memory module latch the refresh address and begin counting at a predetermined rate. For each value, at most one memory rank in the system has a matching PRN. Each memory module has circuitry that compares the refresh register value with the PRNs of its memory ranks, and on a match, sends a refresh signal to the matching rank. All of the SDRAMs of that rank are then refreshed. The arbiter, in reconfiguring the cross-bar switch, uses its own refresh register to track which memory rank is being refreshed, thereby restricting access to that rank.

The refresh registers, instead of addressing the ranks directly, could be used as pointers to a table, with the table providing the PRN of the rank to be refreshed.

However due to increased complexity, this is a less-preferred embodiment.

A directory module 70 keeps track of which CPU or I/O device owns each cache block in memory and itself comprises SDRAMs or other memory devices in need of refresh. Like the memory modules, the directory has its own counting refresh register 71. For each value the refresh register takes on, a designated line associated with a particular memory rank is refreshed along with the memory rank.

Figure 2:
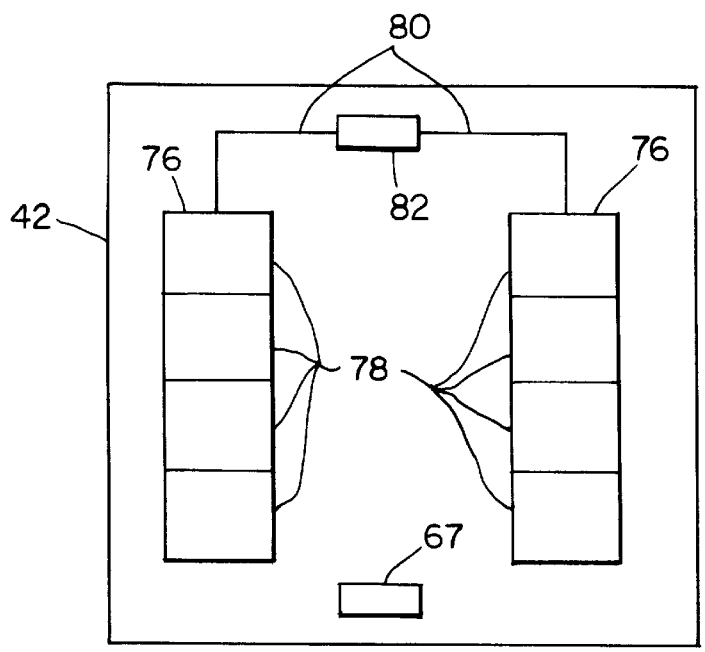
FIG. 2 is a diagram showing the layout of the memory units within a memory module.
Figure 3:
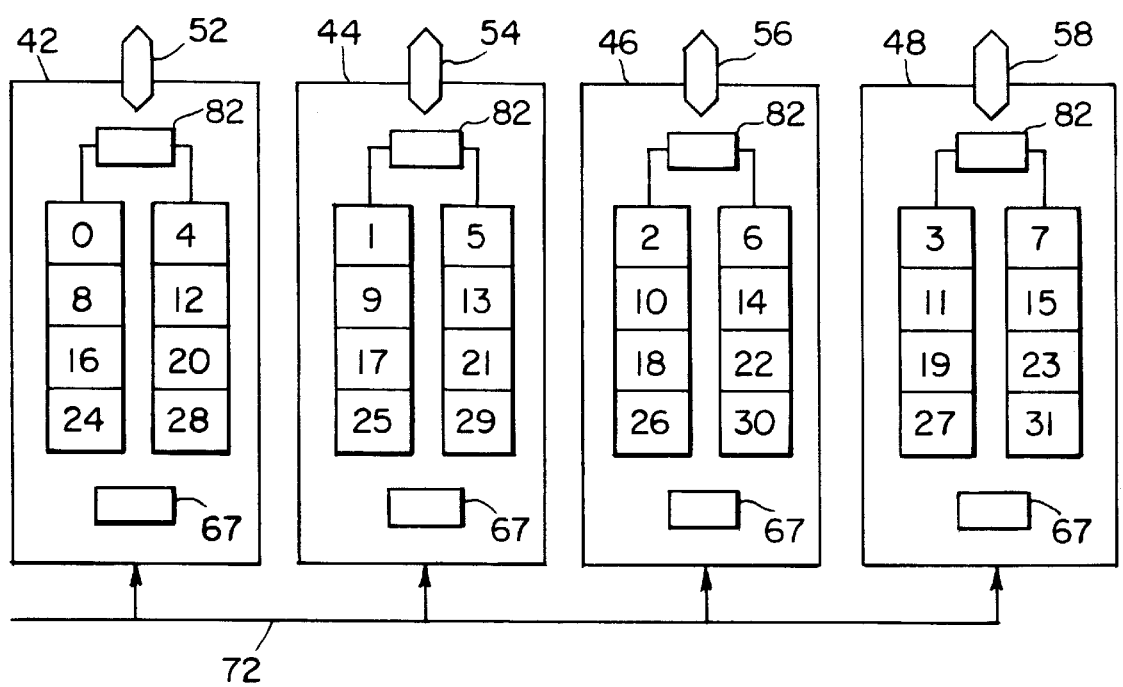
FIG. 3 illustrates the interleaving scheme.

The structure of a memory module is illustrated in FIG. 2. Each module 42 has a data link 82 which transfers data to and from the crossbar switch 20. A module 42 holds two memory arrays 76. A separate data path 80 for each array connects the array to the data link 82. Each array 76 has up to four SDRAM memory ranks 78, resulting in eight ranks in a single module. Within a module the ranks are interleaved between the arrays. Four modules yield thirty-two memory ranks, which are interleaved so that sequentially addressed ranks are in different memory modules. FIG. 3 illustrates this interleaving scheme. Thus, for example, sequential memory accesses from an internal address in rank 13 would sequence through ranks 14, 15, 16, and so on.

For refresh purposes, each memory rank has a unique address or physical rank number (PRN). Refresh units correspond to the interleaved rank units in that it is required that an entire rank be refreshed at one time, since when any device within the rank is being refreshed, none of the devices within the rank are available. However, the sequencing of PRNs can be independent of the interleaved logical addressing of the ranks. In the preferred embodiment, the PRN is indeed independent of the interleave scheme and is fixed to a memory port, i.e. the PRN is dependent on a rank's physical location on a memory module as well as the physical placement of the memory module in a backplane.

Referring back to FIG. 1, to start the refresh registers counting, a refresh signal is broadcast by the arbiter 64 to the memory modules 42, 44, 46, 48, via transaction bus 72, accompanied by a memory rank address. Each memory module, as well as the arbiter, latches the address in its refresh register 65, 67 and begins incrementing its refresh register at a predetermined rate stored in a refresh configuration register (not shown). Thus at any given time all of the refresh registers 65, 67 have the same value. The ability to start the counting with any PRN allows the arbiter to begin refreshing where it will have the least impact on system performance.

Figure 4:
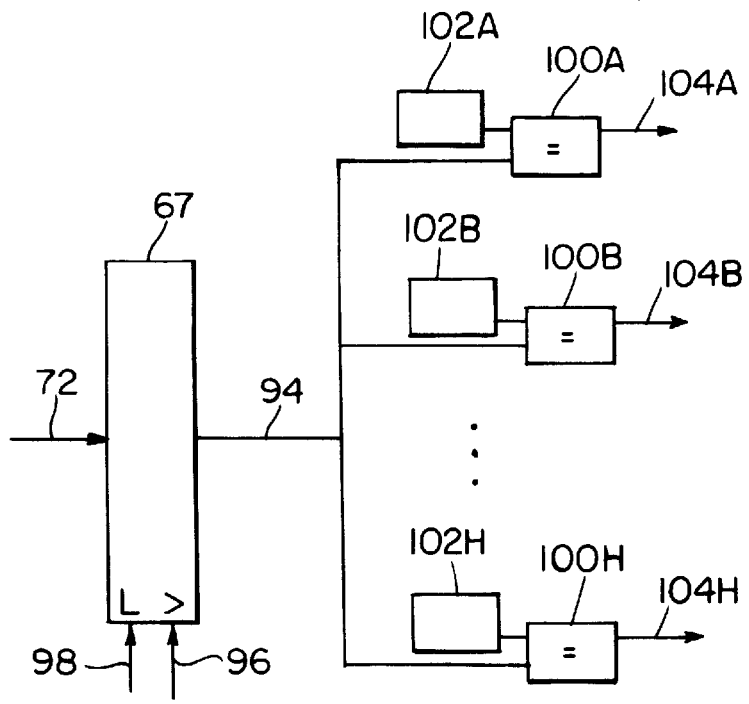
FIG. 4 is a simplified block diagram of the memory module refresh logic for the preferred embodiment.

FIG. 4 shows a simplified block diagram of the refresh logic on a memory module. A refresh signal from the arbiter is delivered on the transaction bus 72, accompanied by a refresh address which is latched into a refresh register 67. The refresh signal enables pulses separated by a preprogrammed number of system clock cycles. These pulses are fed into the increment input 96 of the refresh register, each pulse causing the value stored in the refresh register to increment by one. The output of the refresh register 94 goes to one of two inputs in a series of eight digital comparators 100A through 100H, where each comparator corresponds to one of the memory ranks on the memory module. The other input to each comparator comes from a register 102A through 102H, one per memory rank, holding the PRN for the corresponding memory rank. The outputs 104A through 104H of the comparators are refresh signals corresponding to each of the memory ranks. These refresh signals must then be encoded into the proper input signals required by the SDRAMs.

Regardless of whether the SDRAM internal banks are interleaved, an entire SDRAM is refreshed at one time. Therefore, when a memory rank PRN matches the value of a refresh register on that memory module, the module can initiate a refresh to that rank immediately only if all SDRAM banks in the selected rank are idle. If not all of the SDRAM banks are idle, the module waits until the currently active banks are idle and have met the pre-charge time, and then initiates a refresh. Once the rank has been refreshed and the pre-charge time has been met, the rank is available for read, write or further refresh transactions. The arbiter, by accessing its own refresh register 65, is aware of the delayed refresh without any communication from the memory module.

A transaction to a rank that is doing an auto-refresh is ignored, so it is the responsibility of the arbiter 64 not to issue a memory transaction to a rank that is being refreshed. The arbiter, by accessing its own refresh register 65 which increments at the same time as the other refresh registers, tracks which memory rank is being refreshed and restricts access to that rank during the refresh cycle.

As the refresh registers continue to increment, each memory rank is refreshed in PRN order such that only one rank is being refreshed at any time. At the end of one counting sequence, each memory rank has had one row refreshed.

Figure 5:
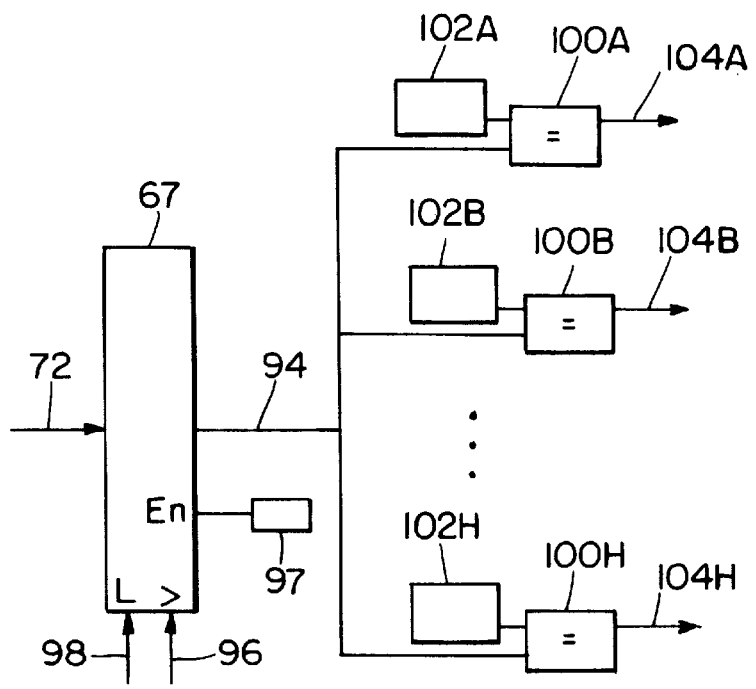
FIG. 5 is a simplified block diagram for an alternative embodiment where timers are to begin the refresh sequence.

FIG. 5 illustrates an alternative embodiment. Instead of a refresh signal from the arbiter starting the counting sequence, a timer 97 is associated with each memory module and with the arbiter. Each timer independently times a refresh interval and initiates the counting sequence by enabling a refresh register 67. The timers are initialized and synchronized as part of the memory configuration. Since all of the timers are initialized together, they are running in lock-step, all having the same value at any given time. This results in only one memory rank being refreshed at any time. As with the preferred embodiment, the arbiter uses its refresh register to identify the rank being refreshed, in order to restrict access to that rank. In this embodiment, since each memory module has its own timer to start the counting sequence, the arbiter does not need to send refresh signals to the memory modules via the transaction bus.

Figure 6A:
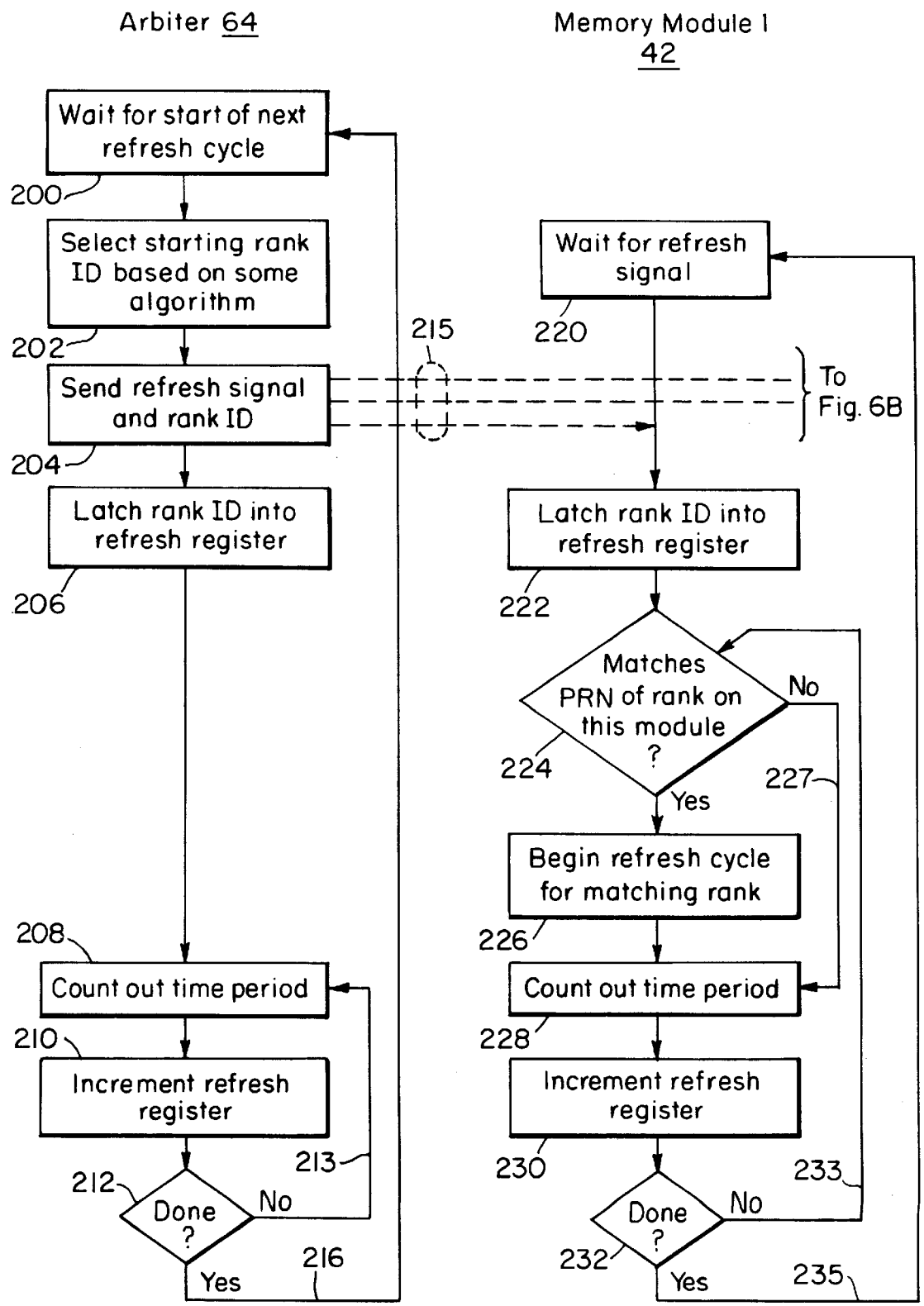
FIGS. 6A and 6B comprise a flowchart illustrating the general flow of execution for the arbiter, memory modules and directory for the embodiment shown in FIG. 1.
Figure 6B:
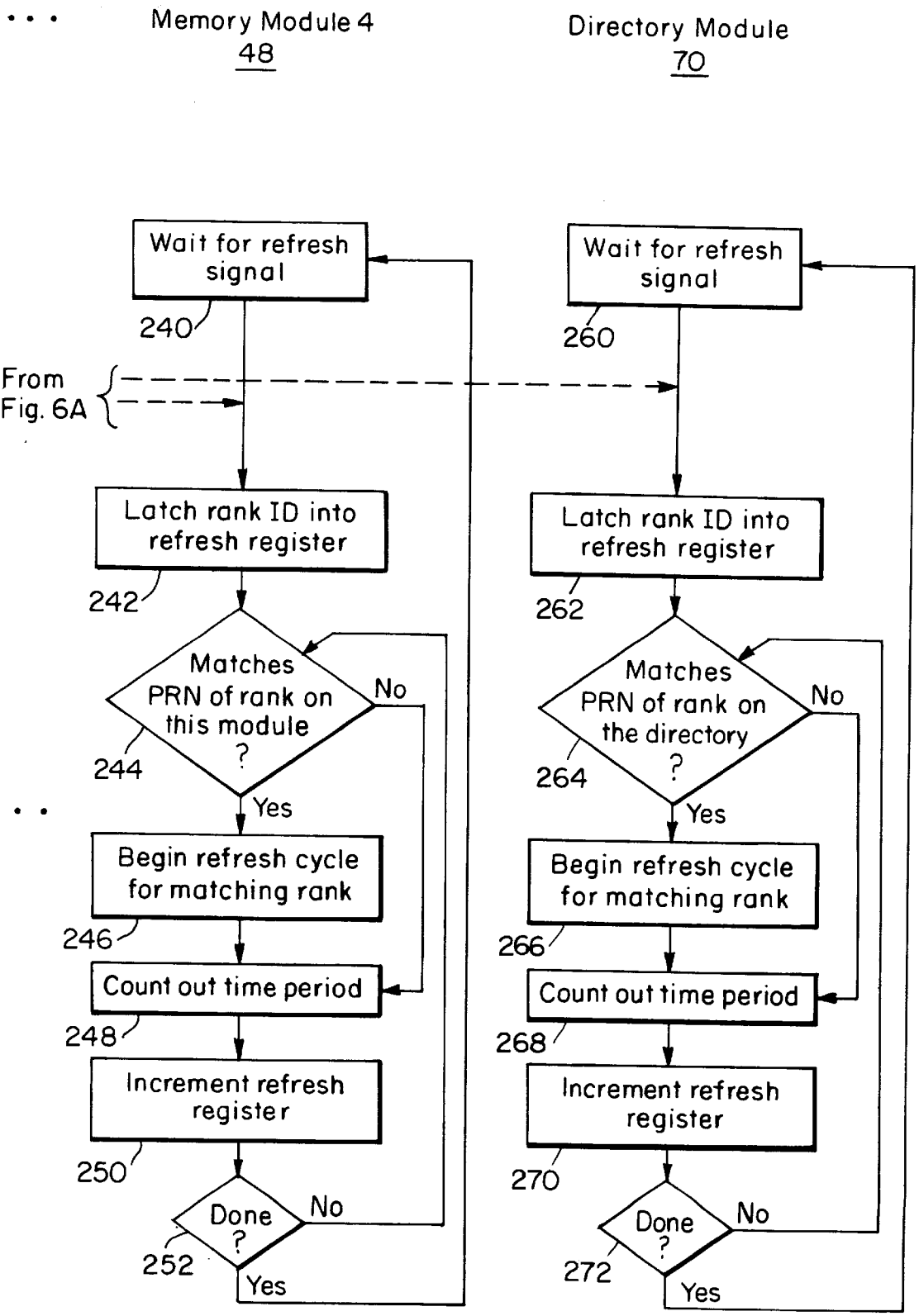

FIGS. 6A and 6B comprise a flowchart illustrating the general flow of execution for the arbiter, memory modules and directory for the embodiment shown in FIG. 1. The arbiter 64 waits for the start of a refresh cycle (step 200). Once the refresh cycle begins, the arbiter selects a rank ID with which to begin the cycle, based on some algorithm, for example a round robin algorithm (step 202). The arbiter sends a refresh signal and the selected rank ID 215 to the memory modules (42, 48) and the directory module 70 (step 204). The arbiter latches the rank ID into its own refresh register and thus is aware of which rank, if any, is being refreshed (step 206). The arbiter is therefore able to restrict access to that rank during the refresh. At the end of the period allotted for a refresh (step 208), the refresh register's value is incremented (step 210) and the process continues (steps 212, 213) until all rank IDs have been cycled through. After the cycle, the arbiter again waits for the beginning of the next cycle (steps 216, 200).

Because the flows of execution for the memory modules 42, 48 (and 44 and 46 shown only in FIG. 1) are identical, module 42 waits for the refresh signal and rank ID 215 from the arbiter (step 220). Upon receiving the refresh signal and rank, the memory module latches the rank ID into its refresh register (step 222). If the latched rank ID matches (step 224) the physical rank number PRN of a memory rank on the memory module 42, a refresh command is sent to the identified rank (step 226). Otherwise no refreshing is done on this memory module (step 227). In either case, at the end of the period allotted for a refresh (step 228), the refresh register's value is incremented (step 230) and the process continues (steps 232, 233) until all rank IDs have been cycled through once. After that cycle, the memory module again waits for the next refresh signal from the arbiter.

Refreshing of the directory module 70 is identical to that of the memory modules; therefore it need not be discussed. Of course, in the directory module there will be a match for every rank present in memory.

Figure 7A:
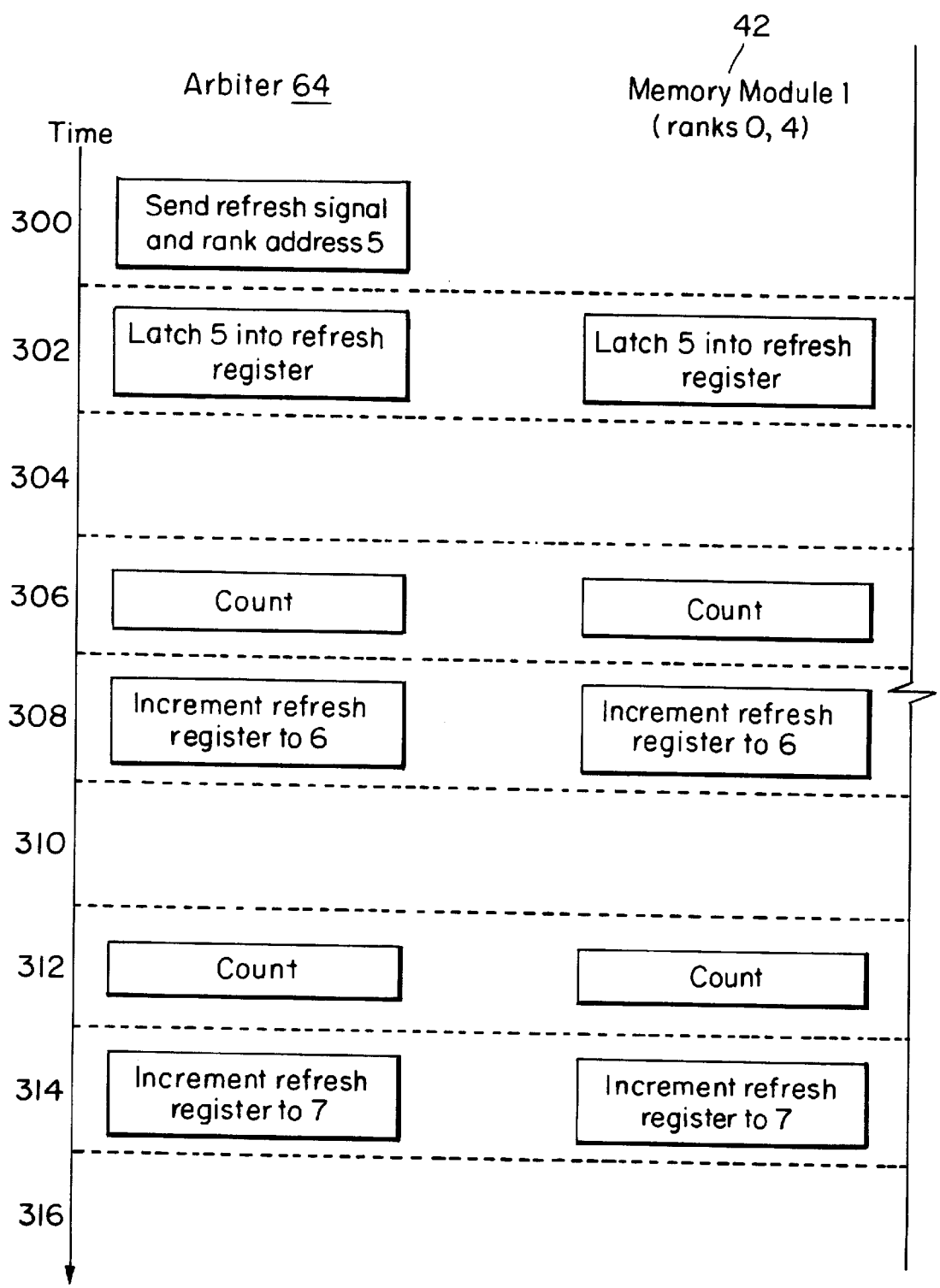
FIGS. 7A through 7C comprise a block diagram illustrating the timing of the embodiment of FIGS. 6A and 6B.
Figure 7B:
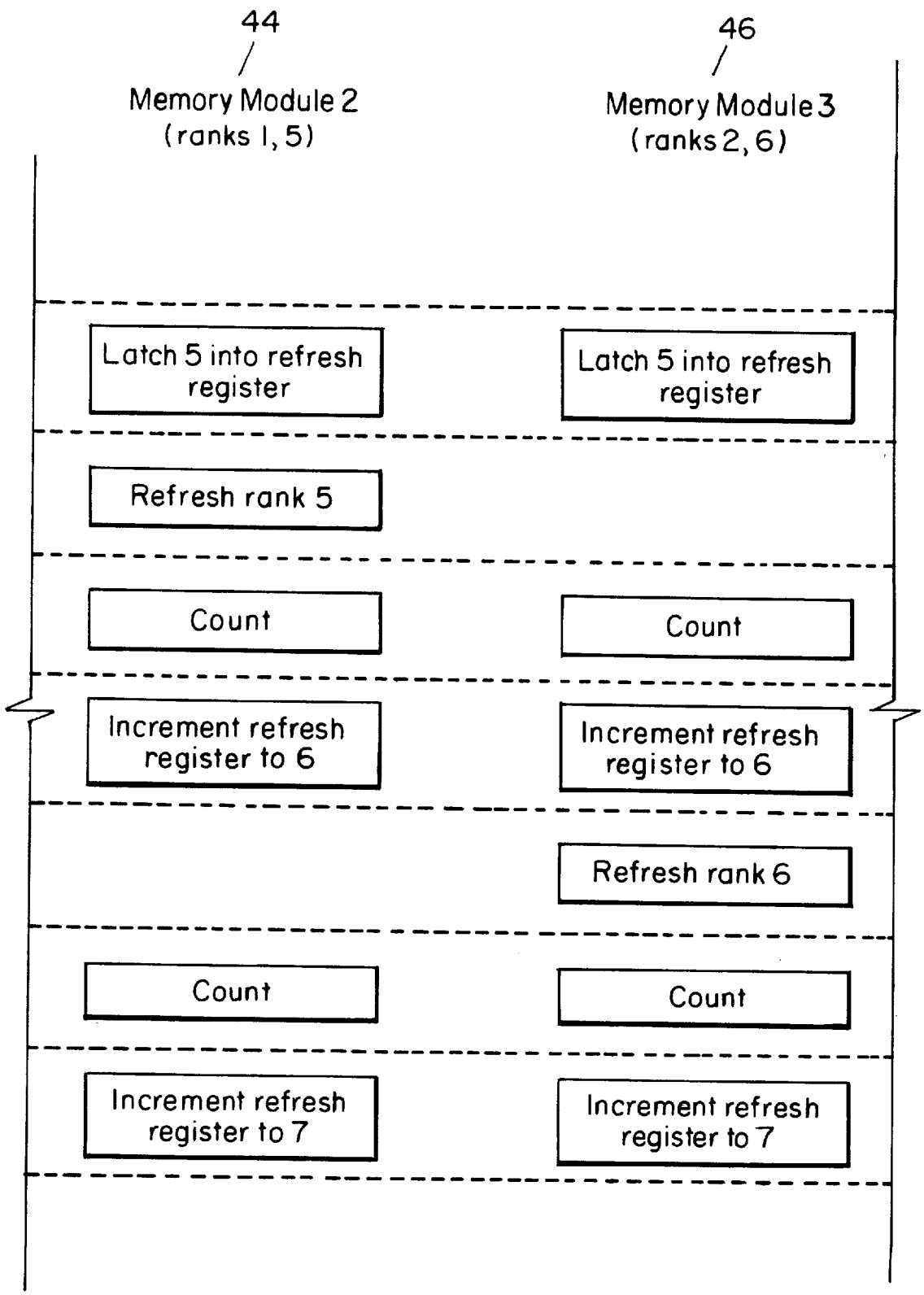
Figure 7C:
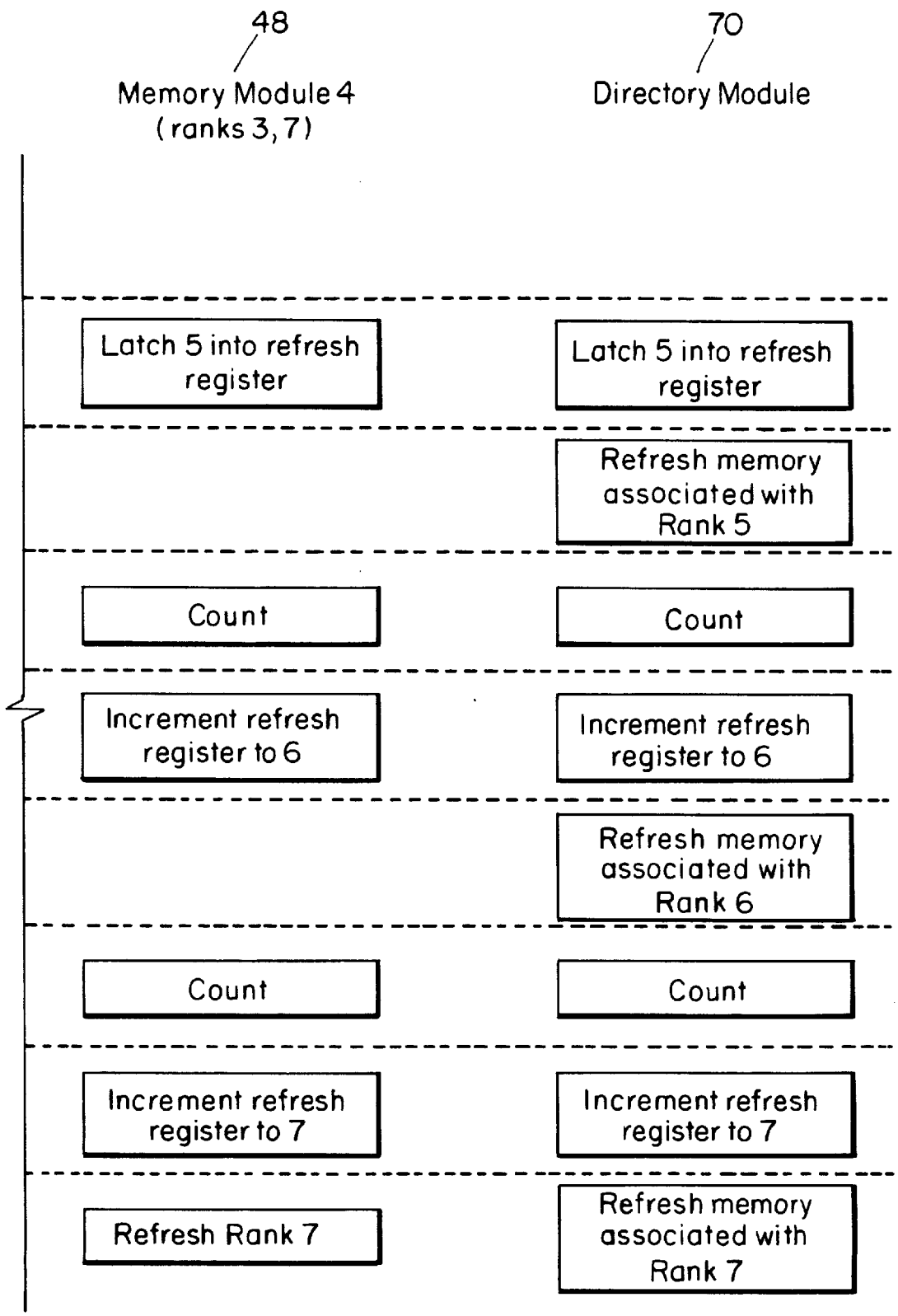

FIGS. 7A through 7C comprise; a block diagram illustrating the timing of the embodiment of FIGS. 6A and 6B. FIGS. 7A through 7C presume that each memory module has only two memory ranks as shown. However, it should be noted that the present invention is not limited only to two memory ranks per module. At 300 the arbiter begins the refresh cycle by sending a refresh signal and a rank ID, in this example a rank ID of 5, to all of the memory modules and the directory module. At 302, the arbiter, memory modules and directory module all latch the rank ID (5) into their respective refresh registers. At 304, the memory module containing Rank 5 (Module 2 in this example) sends a refresh signal to Rank 5. Likewise, the Directory Module will have a match and will refresh its memory associated with Rank 5. All modules count independently but in synchronization 306 and at the end of the period allotted for a refresh, each increments 308 the value in its respective refresh register, in this example, to 6. The process repeats 310–316, with Memory Module 3 refreshing Rank 6 at 310 and Memory Module 4 refreshing Rank 7 at 316. The directory module refreshes its memory associated with the rank being refreshed. Not shown, the process continues until all rank IDs have been cycled through once.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A memory system comprising:
   a plurality of memory units;
   an arbiter which controls access to the memory units and restricts access to a memory unit being refreshed; and
   respective refresh registers, associated with the memory units and arbiter, each refresh register sequencing independently of the other refresh registers through memory unit identifiers such that at any given time, all of the refresh registers identify the same memory unit, each memory unit being triggered to a refresh when a refresh register associated with the memory unit has a designated value, and the refresh register associated with the arbiter identifying the memory unit being refreshed, the arbiter restricting access to that memory unit.

2. A memory system as claimed in claim 1, wherein said memory units are interleaved.

3. A memory system as claimed in claim 1, further comprising:
   a plurality of memory modules, each memory module having the capacity to accept plural memory units connected thereto, and each memory module having a refresh register, said refresh register being associated with all of the memory units connected to said memory module.

4. A memory system as claimed in claim 3, further comprising:
   a cross-bar switch for routing access to said memory units, said cross-bar switch being configured by said arbiter.

5. A memory system as claimed in claim 4, wherein said memory units are interleaved to the level of memory ranks, said memory ranks being interleaved among memory arrays, said memory arrays being interleaved within a plurality of memory modules, each memory module having one of said refresh registers, said one refresh register being associated with all of the memory units within said memory module.

6. A memory system as claimed in claim 5, wherein said memory units are further interleaved among banks internal to SDRAMS, said SDRAMs being within said ranks.

7. A memory system as claimed in claim 3, wherein said refresh registers are counters which increment at intervals of a pre-programmed number of clock cycles, such that a particular memory rank is triggered to an auto-refresh cycle when the refresh register associated with the memory rank matches a unique ID associated with said memory rank.

8. A memory system as claimed in claim 7, wherein said refresh registers begin counting when said arbiter broadcasts a refresh signal to the memory modules.

9. A memory system as claimed in claim 8, wherein the arbiter provides an address with said refresh signal such that the arbiter and memory modules latch said address in their respective refresh registers thereby beginning said counting with said address.

10. A memory system as claimed in claim 7, further comprising:
    respective timers associated with the memory units and arbiter, wherein said timers are initialized and synchronized as part of a memory configuration, said timers, at a refresh interval, causing said refresh registers to begin counting.

11. A memory system as claimed in claim 3, further comprising:
    a directory module, said directory module comprising memory lines corresponding to memory cache blocks associated with said memory units, and a refresh register associated with said directory module, said memory lines requiring a periodic refresh and being triggered to a refresh when said refresh register has a value designating said corresponding memory unit.

12. A memory system comprising:
    a cross-bar switch;
    a plurality of interleaved memory modules, each memory module comprising interleaved memory arrays and a bus interface unit, said bus interface unit providing a connection to said cross-bar switch;
    said memory arrays each comprising interleaved memory ranks where each memory rank is assigned a unique physical rank number (PRN), said memory ranks comprising a plurality of SDRAMs;
    an arbiter connected to said cross-bar switch and to said memory modules, said arbiter controlling access to the memory modules by configuring the cross-bar switch, said arbiter also broadcasting a refresh command to all memory modules and restricting access to a memory rank being refreshed; and
    respective refresh registers associated with the arbiter and memory modules which count by incrementing at intervals of a pre-programmed number of clock cycles, wherein the SDRAMs in a particular memory rank on a memory module are triggered to an auto-refresh cycle when the refresh register associated with the memory module matches the PRN of said memory rank, the refresh register associated with the arbiter identifying the memory rank being refreshed thereby allowing the arbiter to restrict access to that memory rank.

13. A memory system as claimed in claim 12 wherein the arbiter provides an address with said refresh signal such that the arbiter and memory modules latch said address in their respective refresh registers thereby beginning said counting with said address.

14. In a memory system, a method of refresh scheduling, comprising:
    controlling, with an arbiter, access to a plurality of memory units, said arbiter and memory units having associated refresh registers;
    sequencing each of said refresh registers, independently of the other refresh registers, through memory unit identifiers such that at any given time, all of the refresh registers identify the same memory unit; and triggering a refresh to a memory unit when a refresh register associated with the memory unit has a designated value, said arbiter using its associated refresh register to identify the memory unit being refreshed to restrict access to that memory unit.

15. A method as claimed in claim 14, wherein said memory units are interleaved.

16. A method as claimed in claim 14, wherein each of plural memory modules has the capacity to accept plural memory units connected thereto, each memory module having a refresh register, said refresh register being associated with all of the memory units connected to said memory module.

17. A method as claimed in claim 16 wherein controlling of access to said memory units is done by configuring a cross-bar switch.

18. A method as claimed in claim 17 wherein said memory units are interleaved to the level of memory ranks, said memory ranks being interleaved among memory arrays, said memory arrays being interleaved within a plurality of memory modules.

19. A method as claimed in claim 18 wherein said memory units are further interleaved among banks internal to SDRAMs, said SDRAMs being within said ranks.

20. A method as claimed in claim 16 wherein said triggering commands a particular memory rank to an auto-refresh cycle when the associated refresh register matches the PRN associated with said memory rank, a refresh register associated with the arbiter designating the memory rank being refreshed thereby allowing restriction of access to that memory rank.

21. A method as claimed in claim 20 further comprising:
broadcasting a refresh signal to all memory modules; and
counting by incrementing said associated refresh registers at intervals of a pre-programmed number of clock cycles, said counting beginning upon said broadcasting of said refresh signal.

22. A method as claimed in claim 21 further comprising:
providing an address of a designated memory rank simultaneous to said broadcasting of said refresh signal;
latching said address into said refresh registers, thereby beginning said counting with said address.

23. A method as claimed in claim 20 further comprising:
initializing and synchronizing timers associated with said memory modules and said arbiter, said initializing and synchronizing being a part of a memory configuration, said timers thereby running in lock-step with each other and said timers sending refresh commands to their associated arbiter and memory modules; and
counting by incrementing said associated refresh registers at intervals of a pre-programmed number of clock cycles, said counting beginning upon receipt of said refresh command from said associated timers.

24. A method as claimed in claim 16, further comprising:
triggering a refresh to a line within a directory module, said line being made of memory devices requiring periodic refresh and corresponding to one of said memory units, said triggering occurring simultaneously with said triggering of said corresponding memory unit.

25. In a memory system, a method of refresh scheduling, comprising:
interleaving a plurality of memory modules, each memory module comprising interleaved memory arrays, each memory array comprising interleaved memory ranks, each memory rank comprising memory devices requiring periodic refresh;
controlling, with an arbiter, access to said memory ranks by configuring a cross-bar switch;
broadcasting a refresh signal to all memory modules;
counting, upon said broadcast of said refresh signal, by incrementing refresh registers associated respectively with said arbiter and with each of said memory modules, said incrementing being performed at a pre-programmed rate;
triggering the memory devices in a particular memory rank to an auto-refresh cycle when a refresh register associated with a memory module matches the PRN associated with said memory rank; and
restricting access to the memory rank being refreshed by reference to the refresh register associated with said arbiter.

26. A method as claimed in claim 25 further comprising:
providing an address simultaneously with said broadcasting of said refresh signal; and
latching said address within said refresh registers, thereby beginning said counting with said address.

27. A memory system comprising:
a plurality of memory units;
arbitration means for controlling access to the memory units and restricting access to a memory unit being refreshed; ad
plural sequencing means for sequencing through memory unit identifiers, a sequencing means associated with each memory unit, each sequencing means sequencing independently of the others, each memory unit being triggered to a refresh when said sequencing means has a designated value, said arbitration means referencing a sequencing means to identify the memory unit being refreshed, thereby restricting access to that memory unit.

* * * * *